(12) United States Patent
Takahashi et al.

(10) Patent No.: US 7,447,950 B2
(45) Date of Patent: Nov. 4, 2008

(54) MEMORY DEVICE AND MEMORY ERROR CORRECTION METHOD

(75) Inventors: Hiroyuki Takahashi, Kanagawa (JP); Hiroshi Furuta, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 691 days.

(21) Appl. No.: 10/844,556

(22) Filed: May 13, 2004

(65) Prior Publication Data

US 2004/0237023 A1    Nov. 25, 2004

(30) Foreign Application Priority Data

May 20, 2003    (JP)    ............... 2003-141449

(51) Int. Cl.
G11C 29/00    (2006.01)
H03M 13/00    (2006.01)

(52) U.S. Cl. ............. 714/702; 714/718; 714/754; 714/768; 365/200; 365/201

(58) Field of Classification Search .......... 714/702, 714/718, 754, 768; 365/200, 201
See application file for complete search history.

(56) References Cited

U.S. PATENT DOCUMENTS

| | | | | |
|---|---|---|---|---|
| 4,412,314 A | * | 10/1983 | Proebsting | 365/222 |
| 4,926,426 A | * | 5/1990 | Scheuneman et al. | 714/772 |
| 5,434,868 A | * | 7/1995 | Aichelmann, Jr. et al. | 714/718 |
| 6,065,146 A | * | 5/2000 | Bosshart | 714/754 |
| 6,735,726 B2 | * | 5/2004 | Muranaka et al. | 714/708 |
| 7,032,142 B2 | * | 4/2006 | Fujioka et al. | 714/718 |

FOREIGN PATENT DOCUMENTS

| | | |
|---|---|---|
| JP | 1-290200 | 11/1989 |
| JP | 3-263685 | 11/1991 |
| JP | 7-45096 | 2/1995 |
| JP | 2003-85970 | 3/2003 |

* cited by examiner

Primary Examiner—Jacques Louis-Jacques
Assistant Examiner—John J Tabone, Jr
(74) Attorney, Agent, or Firm—McGinn IP Law Group PLLC

(57) ABSTRACT

In a memory system, an ECC circuit is not inserted on a data path for data writing/reading. The ECC process is performed during the cycle of normal data reading/writing process, in such timing that it does not conflict with the data reading/writing process in order not to cause a substantial delay in the data writing/reading process. Specifically, the ECC process is performed during the cycle of burst transfer in which a plurality of data are successively input to or output from a shift register. Since no access is made to the memory cell array during the burst transfer cycle, the ECC process does not cause a delay in the reading/writing process.

20 Claims, 10 Drawing Sheets

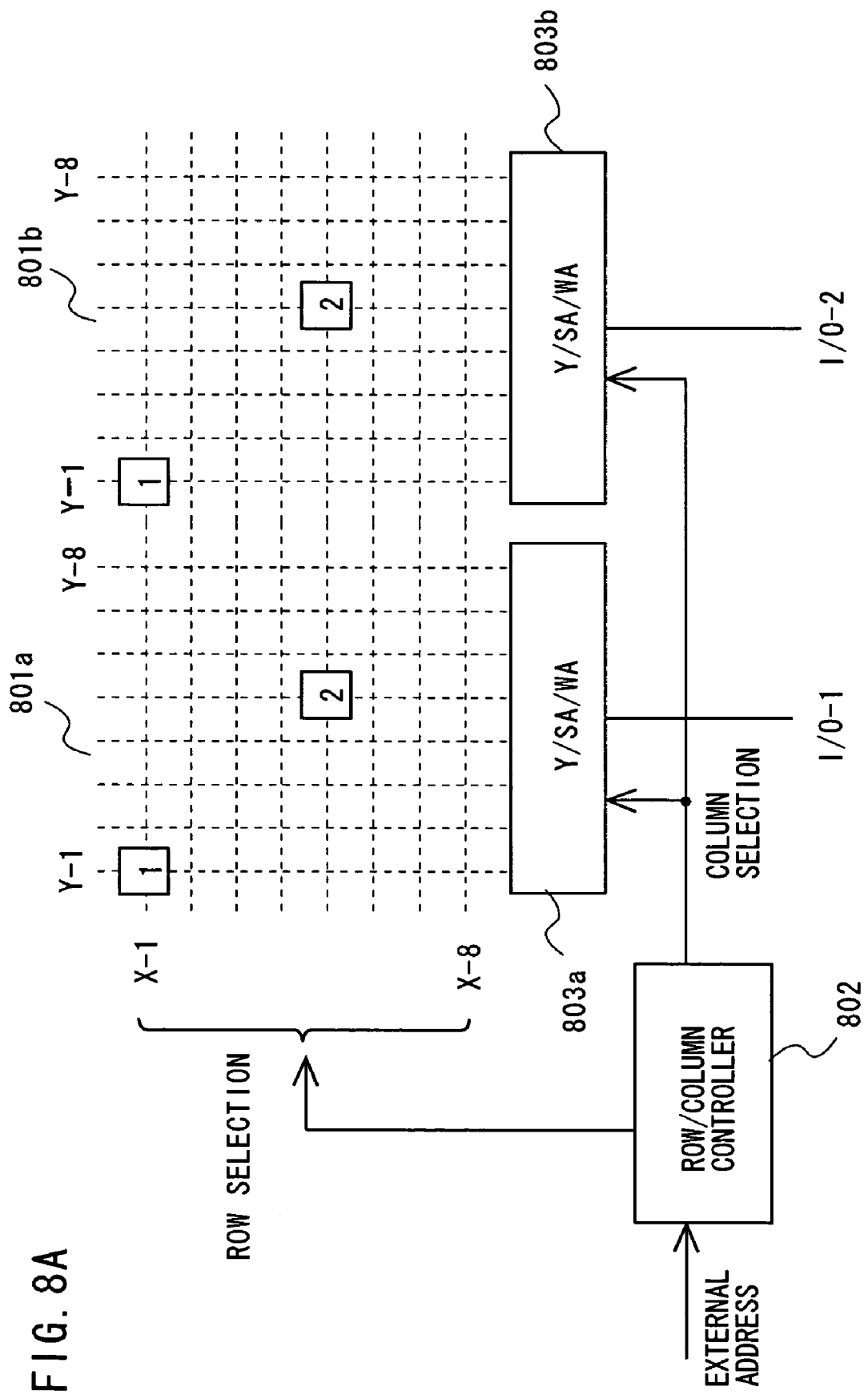

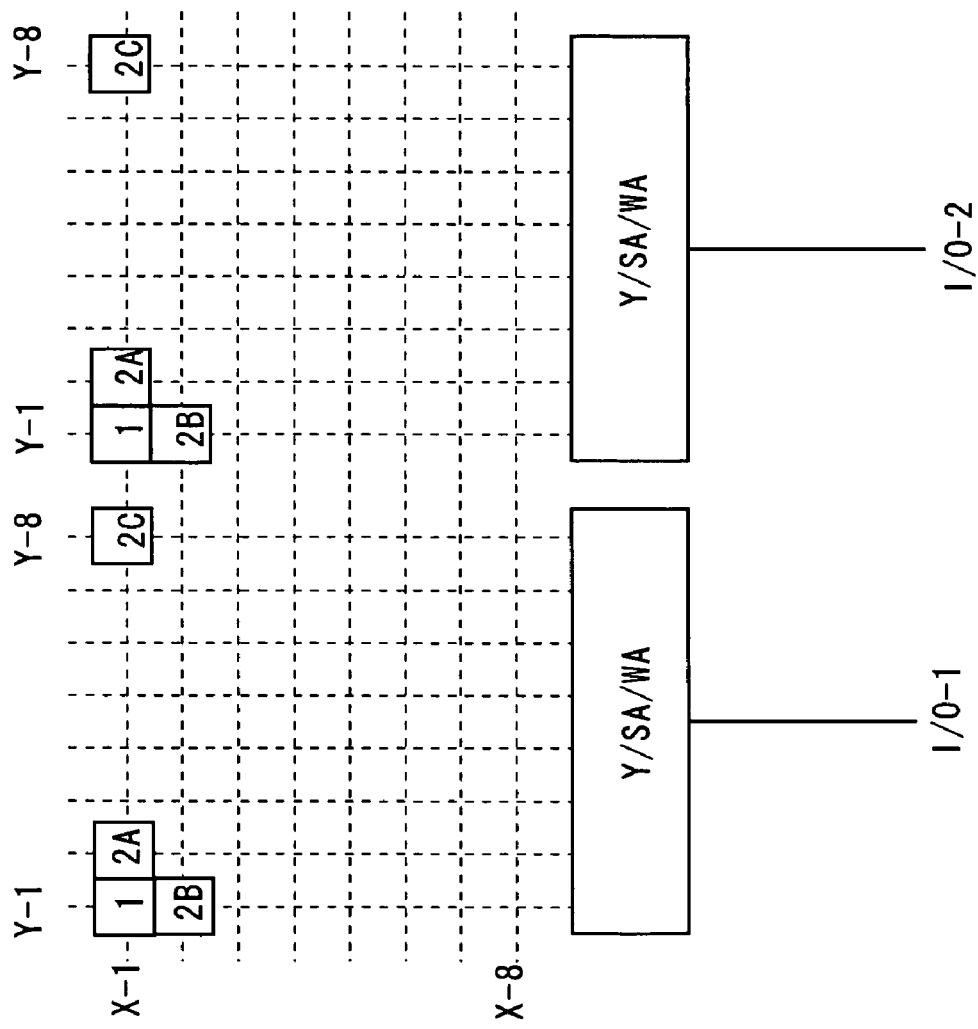

MEMORY DEVICE AND MEMORY ERROR CORRECTION METHOD

BACKGROUND OF THE INVENTION

1. Field of the Invention

The present invention relates to a memory device and a memory error correction method and, more particularly, to a memory device and a memory error correction method capable of an ECC process.

2. Description of a Related Art

A soft error rate (SER) of SRAM (Static Random Access Memory) increases with the miniaturization and low-voltage operation of semiconductor devices, and it is necessary to find an early solution to this problem. The problem of increasing soft error rate is critical in general purpose memory and SRAM cells within a logic LSI. Major factors that determine SER are alpha particles emitted by component materials (such as packaging materials and aluminum lines) of semiconductor devices and high energy neutrons in secondary cosmic rays reaching the ground. Particularly, the high energy neutrons is difficult to block, and it is also difficult to perform the quantitative SER measurement of the high energy neutrons since the flux of the neutron varies depending on location on the ground and time of day.

On the other hand, the current SER of DRAM (Dynamic Random Access Memory) is improved compared to previous-generation products. However, the SER will undesirably increase also in the DRAM with the future miniaturization and low-voltage operation. Thus, the necessity to find a solution to the increasing SER will arise for the DRAM as well, at least in the near future. Besides the soft error caused by the radiation rays, device miniaturization will lead to the characteristic fluctuations of devices, including a characteristic variation by physical statistical fluctuation, a characteristic change with time, and so on. This can cause a normally operating cell to become a defective cell at some point. The characteristic fluctuations are recoverable and reversible in some cases, but are substantially unrecoverable, which is equivalent to a hard error, in other cases. Such soft errors in a broad sense are problematic.

Known as a technique to reduce the SER is to use memory with a function automatically correcting the soft errors. The memory having the automatic error correction function is referred to hereinafter as ECC (Error Check and Correct) memory. The ECC memory stores an ECC code, also called ECC (Error Correcting Code), which is redundant data for error checking and correction, and uses the ECC code to check and correct errors. Though the memory with the ECC function can automatically correct memory errors, it undesirably affects the operating time of a normal reading/writing process. To solve this problem, some techniques to reduce the effect on the operating time of the normal reading/writing process while achieving the ECC function have been developed.

For example, memory having an ECC circuit that does not perform a parity check during a data reading process but performs a parity cell read-out or an error correction during a data writing process is described in Japanese Unexamined Patent Application Publication H1-290200, for example. Specifically, this memory has a memory cell array, a horizontal parity cell array, a vertical parity cell array, an X-decoder for selecting a word line, a Y-decoder for selecting a data line, a horizontal/vertical code selection circuit, a parity check circuit of horizontal/vertical code, and an error correction circuit. In the data reading process, the readout data is output without the parity check.

In the data writing process, on the other hand, at the first voltage level of a standard clock signal, a write data signal is written into a memory cell to be written after reading out memory cell data of the horizontal and vertical codes to which the memory cell to be written belongs. At the second voltage level of the standard clock signal, a horizontal and vertical parity cell data of the horizontal and vertical codes where the memory cell for writing belongs is read out and the parity is checked using the parity cell data and the memory cell data of the horizontal and vertical codes. If an error is detected, the horizontal and vertical parity cell data is rewritten. When refreshing the memory data, the parity check on the memory cell and the parity cell and memory data error correction are performed.

In the above memory structure, since the ECC circuit does not operate during the reading process, it does not affect the operating margin of the reading process. Though the ECC circuit operates during the writing operation, it is extremely difficult for a recent high-speed device to achieve the ECC operation only in part of the writing operation time. The above prior art discloses to perform the ECC process during the refresh process, the number of cycles or a total time required for refresh increases by performing the ECC process, thus increasing a time for gaining access in a system. This causes a delay in the reading/writing operation, decreasing the system performance.

As another example, memory in which an ECC circuit operates according to operation mode and it does not operate during the normal read/write operation is disclosed in Japanese Unexamined Patent Application Publication H07-45096, for example. Specifically, this memory writes given parity information to all inspecting memory cells immediately before a data-retention state with high error rate. It is described that the parity addition can be performed during the normal operation when it does not affect memory access; however, the specific timing is not mentioned at all.

Immediately after the data-retention state, all the information memory cells are checked to detect an error location and error data, referring to the parity information in the inspecting memory cells. The timing of this operation is determined by operation mode of the memory detected by a mode detection system. However, since basically the ECC circuit does not operate during the normal operation in this memory configuration, the ECC circuit substantially does not function in memory where reading process and writing process are frequently repeated, such as high-speed devices.

As yet another example, a cell configuration having a word line, a bit line, and a transistor dedicated for refresh in addition to normal reading/writing process is disclosed in Japanese Unexamined Patent Application Publication H03-263685. However, it describes or suggests nothing about the ECC process. Further, a semiconductor device having the same memory cell configuration as DRAM and operates with SRAM specification is described in Japanese Unexamined Patent Application Publication No. 2003-85970, for example. Refreshing of the memory cells with the same configuration as DRAM is controlled according to a refresh address generated inside, and the refresh process is performed during the reading/writing cycle; thus the refresh process is not recognized from the outside. This prior art, however, does not disclose the ECC process at all.

SUMMARY OF THE INVENTION

In view of the foregoing, it is an object of the present invention to provide a memory system capable of effective error checking and correction.

To these ends, according to one aspect of the present invention, there is provided a memory device comprising a memory cell array comprising a plurality of memory cells for storing data, where access is controlled by an address; and an Error Check and Correct (ECC) process circuit for performing an ECC process on data stored in a memory cell in the memory cell array, wherein a reading/writing process in the memory cell array is performed according to an external address input from an outside, and the ECC process is performed according to an internal address different from the external address during a cycle of the reading/writing process. This configuration enables to perform the ECC process effectively.

The memory device according to the above aspect of the present invention preferably further comprises an internal address generation circuit for generating the internal address independent of the external address. This enables address generation suitable for the ECC process.

In the above aspect of the present invention, it is preferred to perform the ECC process during a burst transfer timing period for sequentially transferring a plurality of data. This ensures to perform the ECC process in such timing that it does not cause a delay in the reading/writing process. Further, it is preferred that the ECC process circuit performs data obtaining, error checking, necessary error correction, and data output to the memory cell array within a time period required for one cycle of burst transfer. This enables to perform the ECC process efficiently. Alternatively, the ECC process circuit may divide one cycle of ECC process comprising data obtaining, error checking, necessary error correction, and data output to the memory cell array into several sections to perform the one cycle of ECC process in a plurality of cycles of burst transfer. This enables to perform the ECC process even when the burst transfer period is short.

In the above aspect of the present invention, it is preferred that the memory cell array comprises a plurality of banks, and the ECC process circuit performs the ECC process on data stored in a bank where external data reading/writing is not being performed. This can reduce the ECC process which conflicts with the reading/writing process.

The above memory device comprising the plurality of banks preferably comprises an ECC control circuit for controlling the ECC process so as to stop the ECC process on a bank where the ECC process is being performed in response to an external access to the bank. This can prevent the ECC process from interrupting the reading/writing process.

Alternatively, the above memory device comprising the plurality of banks preferably comprises an ECC control circuit for controlling the ECC process so as to stop the ECC process or skip the ECC process on a bank where the ECC process is to be performed next in response to an external access to the bank. This can prevent the ECC process from interrupting the reading/writing process.

Alternatively, the above memory device comprising the plurality of banks preferably further comprises a storage unit for storing information for determining a difference in the number of the ECC process performed in each bank; and an ECC control circuit for controlling the ECC process so as to perform the ECC process preferentially on a bank where the number of the ECC process performed is smaller than other banks, based on the information. This can reduce a difference in a frequency of the ECC process among banks.

In the above memory device comprising the plurality of banks, it is preferred that the ECC process in a bank is repeated in a fixed sequence of addresses, and, if the ECC process on a bank is stopped, the ECC process is resumed from an address after an address where the ECC process is completed. This can reduce a bias in the number of ECC process among banks.

Alternatively, the above memory device comprising the plurality of banks preferably comprises a storage unit for storing information for determining an address in a bank where the ECC process is stopped; and an ECC control circuit for controlling the ECC process so as to resume the ECC process from an address determined based on the stored address. This can reduce a bias in the number of ECC process among banks.

In the memory device according to the above aspect of the present invention, it is preferred that each of the plurality of memory cells in the memory cell array comprises a first port and a second port, data reading/writing is performed through the first port in a normal reading/writing process, and data reading/writing is performed through the second port in the ECC process. This can reduce a delay in the reading/writing process caused by the ECC process.

Alternatively, the memory device according to the above aspect of the present invention preferably further comprises an ECC cycle modification circuit for modifying a cycle of the ECC process based on an error occurrence frequency. This enables to perform the ECC process in accordance with the occurrence of an error to enhance the reliability.

Alternatively, in the memory device according to the above aspect of the present invention, it is preferred that the memory cell array stores data with a charge retention element, and the ECC process is performed accompanying a refresh process of the memory cell array. This enables to efficiently perform the refresh process and the ECC process.

Alternatively, the memory device according to the above aspect of the present invention preferably further comprises a spare memory cell for storing data; and a circuit for switching an access destination to the spare memory cell according to an access address to a cell, if the ECC process circuit detects an error a plurality times in the cell of the memory cell array under a predetermined condition. This can reduce repeatedly occurring errors. The memory device preferably further comprises a storage unit for storing an address determined as an error by the ECC process circuit; and a determination circuit for comparing the stored address and an address newly determined as an error to determine whether to change a destination of access by the address. This can specify an error cell effectively.

Alternatively, in the memory device according to the above aspect of the present invention, it is preferred that
the ECC process circuit performs the ECC process on a plurality of addresses of data, and the plurality of addresses of data are stored in memory cells separated from each other in the memory cell array. This enables to perform error correction without a significant area increase, thereby reducing multi-bit mode soft errors.

According to another aspect of the present invention, there is provided a method of correcting an error of data stored in a memory cell array, comprising performing a reading/writing process of external data to the memory cell array according to an external address; generating an internal address used for error correction; and performing an ECC process including error checking and correction on data stored in an area of the memory cell array specified by the internal address, during a cycle of the reading/writing process of external data to the memory cell array. This configuration enables to perform the ECC process effectively.

According to another aspect of the present invention, there is provided a memory device comprising a serial-parallel conversion circuit for converting data between serial and parallel; a plurality of memory cells for storing data; an internal address generation circuit for generating an internal address; an external address pin for introducing an external address; an ECC code generation circuit for generating an ECC code based on data; and an ECC check and correct circuit for checking and correcting data based on the ECC code, wherein data writing is performed in such a way that serial data supplied to a data input pin is converted into parallel data in the serial-parallel conversion circuit, an ECC code is generated based on the parallel data in the ECC code generation circuit, and the parallel data and the ECC code are stored in a memory cell corresponding to a first external address, data reading is performed in such a way that parallel data stored in a memory cell corresponding to a second external address is supplied to the serial-parallel conversion circuit without being processed in the ECC check and correct circuit, converted into serial data, and supplied to an data output pin, ECC checking and correction is performed during the data writing or the data reading in such a way that data and an ECC code stored in the memory cell corresponding to the internal address are checked in the ECC check and correct circuit, and if the data is corrected, the corrected data is stored in the memory cell array without being supplied to the data output pin. It is thereby able to provide a memory device capable of performing the ECC process without causing a substantial delay in the data writing/reading process to the memory cell.

According to another aspect of the present invention, there is provided a memory device, comprising a plurality of banks comprising at least a first bank and a second bank; an external address pin for introducing an external address comprising a bank selection bit; an internal address generation circuit for generating an internal address comprising a bank selection bit; and a comparison circuit for comparing the bank selection bit of the external address and the bank selection bit of the internal address and outputting a control signal, wherein while reading/writing access is made to the first bank corresponding to the external address, if the control signal indicates no match, the ECC process is performed on the second bank corresponding to the internal address, and, if the control signal indicates match, the ECC process is stopped on the second bank corresponding to the internal address. It is thereby able to provide a memory device capable of performing the ECC process without causing a substantial delay in writing/reading access.

According to another aspect of the present invention, there is provided a memory device comprising a dual port memory cell in which one cell comprises two transistors and one capacitor, wherein a reading/writing process is performed by an external address through a first port of the dual port memory cell, and an ECC process is performed by an internal address through a second port of the dual port memory cell. This can reduce the effect of the ECC process on the reading/writing operation to the memory cell.

According to another aspect of the present invention, there is provided a memory device for performing an ECC process on a plurality of addresses of data, comprising a memory cell array comprising a plurality of memory cells for storing data, from which a memory cell corresponding to an internal address is selected; and a controller for generating an internal address corresponding to each of the plurality of addresses, so that the plurality of addresses of data are stored in memory cells separated from each other from the plurality of addresses. This enables to perform error correction without a significant area increase, thereby reducing multi-bit mode soft errors.

The present invention enables effective memory error correction.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIG. 8A is a view to explain physical mapping of data in a memory system according to the sixth embodiment of the present invention.

FIG. 8B is a view to explain physical mapping of data in a conventional memory system.

DESCRIPTION OF THE PREFERRED EMBODIMENTS

Preferred embodiments of the present invention are described hereinbelow. The explanation provided hereinbelow merely illustrates the embodiments of the present invention, and the present invention is not limited to the below-described embodiments. The description hereinbelow is appropriately shortened and simplified to clarify the explanation. A person skilled in the art will be able to easily change, add, or modify various elements of the below-described embodiments, without departing from the scope of the present invention.

Embodiment 1

Figure 1:
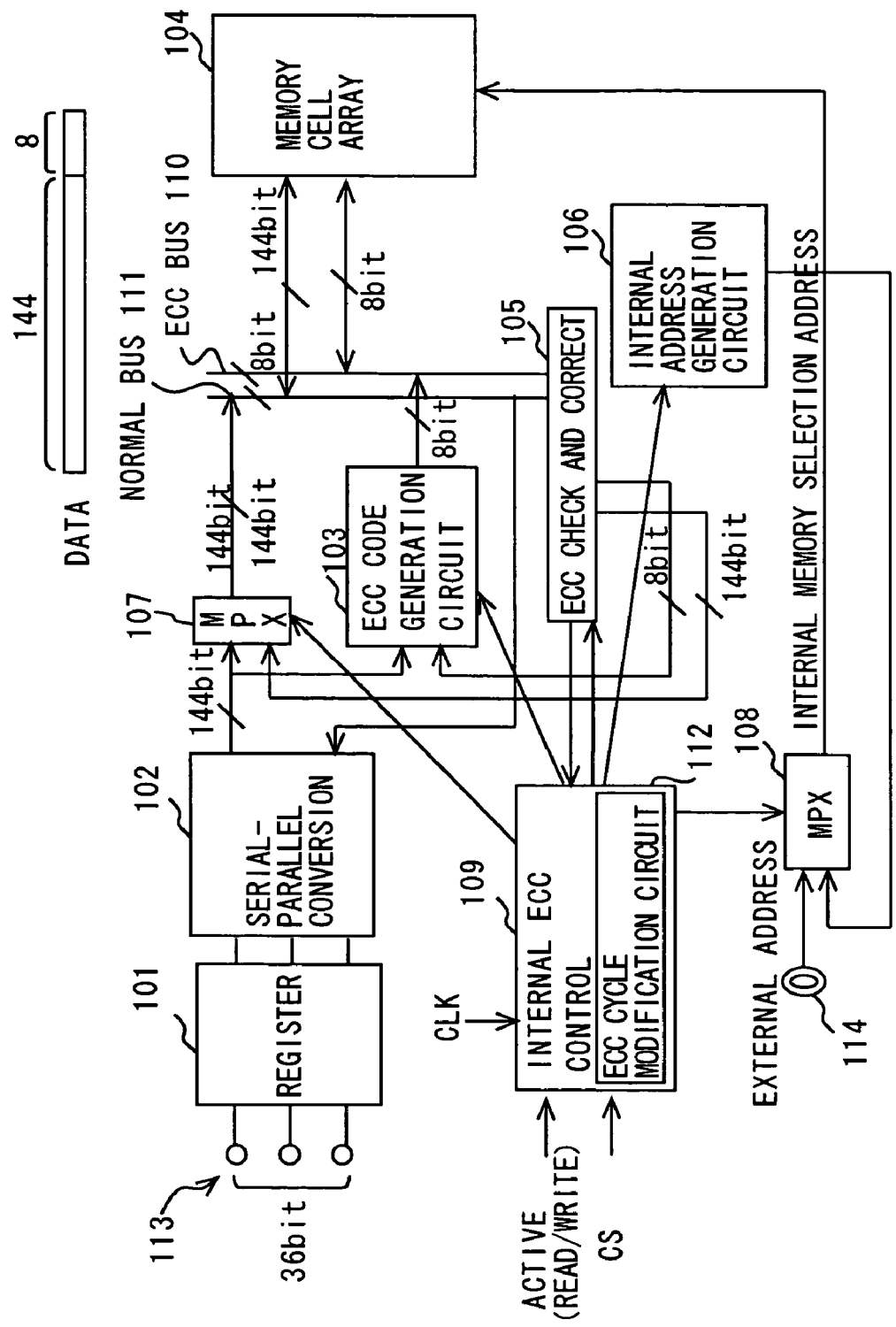
FIG. 1 is a block diagram illustrating a memory system configuration according to the first embodiment of the present invention.

Referring first to FIG. 1, a block diagram illustrating the configuration of an ECC (Error Check and Correct) memory system 100 in a semiconductor circuit device according to the first embodiment of the present invention is shown. Though this embodiment is explained in conjunction with SRAM, the present invention is also applicable to DRAM. The memory system 100 of this embodiment performs an ECC process using an internal circuit. In the memory system 100 shown in FIG. 1, external data is input to a register 101. In this example, the register 101 has 36 input/output pins and 36-bit data is input thereto. In typical memory, 9-bit to 36-bit data is input or output. Normally, 8 bits of the 9-bit data is data, and 1 bit is a parity bit.

A serial-parallel conversion circuit 102 converts serial data input from the outside to parallel data, and parallel data from the inside to serial data. FIG. 1 shows an example where one parallel data is generated from four data (and vice versa). Since the input/output data is 36 bits, the internal data is 144 bits. The serial-parallel conversion circuit 102 enables to increase the transfer rate of an interface without significantly increasing the internal operating frequency. Further, it is able to reduce the number of pins, which can reduce a chip surface area and noise.

An ECC code generation circuit 103 generates an ECC code according to input data and outputs it to an ECC bus 110. Since the internal data is 144 bits, 8-bit of ECC code is added to the data. The ECC code can be generated by using widely known technique. A memory cell array 104 stores the external input data and the ECC code according to external address data. An ECC check and correct circuit 105 obtains the data and the ECC code from the memory cell array 104 and performs ECC checking and correction if necessary. The ECC code generation circuit 103 generates an ECC code according to the input data from the outside or the data from the ECC check and correct circuit 105.

An internal address generation circuit 106 generates an internal address for the ECC process. A multiplexer 107 selects one from the external input data from the serial-parallel conversion circuit 102 and the data from the ECC check and correct circuit 105 and outputs the data to a normal bus 111. A multiplexer 108 selects one from an external address and an internal address. An internal ECC control 109 controls each circuit for the ECC process. The internal ECC control 109 performs necessary control of each circuit according to control signals such as a reading/writing active signal, a clock signal, and a chip selection (CS) signal. The internal ECC control 109 has an ECC cycle modification circuit 112 to modify the frequency or cycle of the ECC process.

The process of writing data to the memory cell array 104 is explained below. Data is input from the outside to the register 101 through the input/output pins and then converted to parallel data by the serial-parallel conversion circuit 102. The multiplexer 107 selects the input from the serial-parallel conversion circuit 102 according to control by the internal ECC control 109 and places the data onto the normal bus 111. The multiplexer 108 selects the external address according to control by the internal ECC control 109 and outputs the address as an internal memory selection address. The data placed on the normal bus 111 is then written to an area (memory cell) of the memory cell array 105 specified by the external address.

The data from the serial-parallel conversion circuit 102 is also input to the ECC code generation circuit 103 in parallel with the path transmitted to the memory cell array 104. The ECC code generation circuit 103 generates an ECC code according to the input data. In this example, it generates 8-bit ECC code for 144-bit data. The generated ECC code is placed onto an ECC bus 110 and written to the memory cell array 104 together with the data on the normal bus 111. The 144-bit data and the 8-bit ECC code can be written to or read from the memory cell array 104 in one process.

The process of reading data from the memory cell array 104 is explained below. In the data reading process from the memory cell array 104, the multiplexer 108 selects an external address according to control by the internal ECC control 109. The data is read out from the area specified by the external address. The readout data is output to the normal bus 111, converted to serial data by the serial-parallel conversion circuit 102, and then output to the outside.

Now, the process of ECC checking and correction in the memory system 100 according to this embodiment is explained hereinafter with reference to FIG. 2. In the memory system 100 of this embodiment, an ECC circuit is not inserted on a data path for normal data writing or reading. Though the ECC process is performed during the cycle of normal data reading/writing process, it is performed at such timing that it does not conflict with the data reading or writing process. The ECC process thus does not cause a substantial delay in the normal data writing or reading process.

Figure 2:
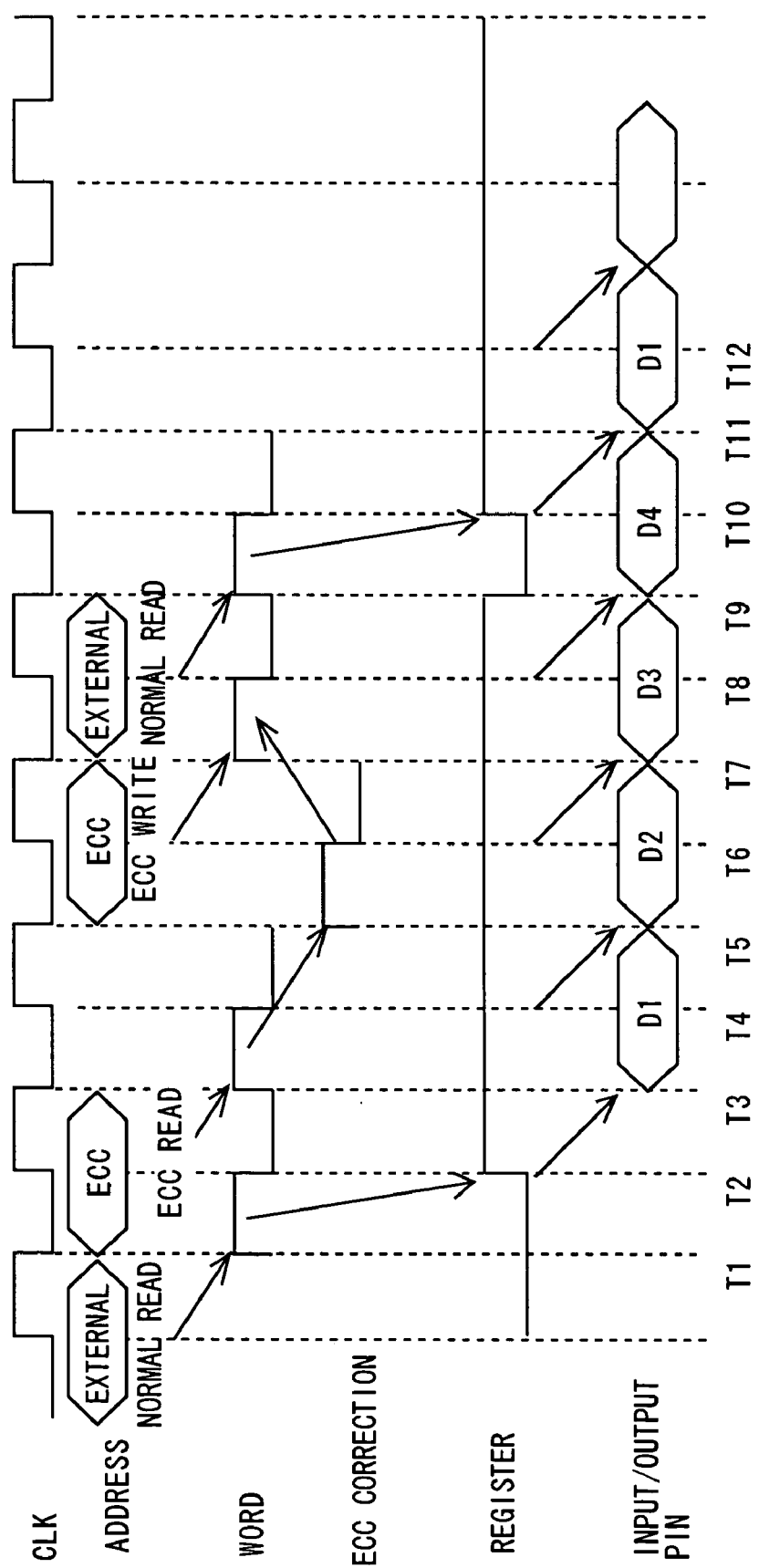
FIG. 2 is a timing chart relating to an ECC process accompanying a reading process in the memory system according to the first embodiment of the present invention.

Referring now to FIG. 2, a timing chart to explain the ECC process in the memory system 100 of this embodiment is shown. T(N) indicates rise/fall timing of a clock signal, and it is a rise timing if N is an uneven number and is a fall timing if N is an even number. FIG. 2 shows the timing of the ECC process in the data reading process. The ECC process is performed in parallel with the reading process, in such timing that it does not delay the reading process. First, upon input of an external address, the multiplexer 108 selects and outputs the external address according to control by the internal ECC control 109.

In the timing of T2 to T3, a word line is selected in the memory cell array 104 and data are read out form specified address areas. In the timing of T3, data loading into the register 101 starts, and data are sequentially loaded into the register 101 until the timing reaches T10

To the register 101, four data D1 to D4 converted from parallel to serial are sequentially input. The register 101 sequentially outputs the serial data to the outside in the timing period T4 to T12. Generally, such output process is called a burst operation. In this example, the period from the beginning to the end of the four data transfer is one cycle of burst transfer, and the period T4 to T12 is a time period required for one cycle of the burst transfer.

On the other hand, in the timing period T2 to T4, which coincides with the timing of reading data from the memory cell array 104, the multiplexer 108 selects and outputs an ECC reading address, which is an internal address form the internal address generation circuit 106. In the subsequent timing period T4 to T5, the area specified by the internal address becomes active and data for ECC is read out. The data for ECC contains original data and an ECC code. In the timing period T6 to T7 during which data are sequentially output from the register 101, the ECC check and correct circuit 105 performs ECC checking and correction. The correction process is performed when needed. The ECC checking and correction are performed using a widely-known technique.

In the timing period T6 to T8, the multiplexer 108 selects and outputs an ECC writing address from the internal address generation circuit 106. The ECC writing address is the same address as the ECC reading address. In T8 to T9, the data for which, the ECC process has been performed is written back to the original address of the memory cell array 104. This data contains an ECC code in addition to the original data.

The original data after the ECC process from the ECC check and correction circuit 105 is selected by the multiplexer 107 and placed onto the normal bus 111. The ECC code is sent from the ECC check and correct circuit 105 to the ECC code generation circuit 103. The ECC code generation circuit 103 outputs the received ECC code without any change. It is also possible to make a path for transmitting corrected data output from the ECC check and correction circuit 105 to the ECC code generation circuit 103 and the ECC code generation circuit 103 generates an ECC code. In this case, there is no need to send the ECC code from the ECC check and correct circuit 105 to the ECC code generation circuit 103. In the timing period T8 to T10, the multiplexer 108 selects and outputs the external address to the memory cell array 104. After the ECC-processed data is written to the memory cell array 104, the reading process in the next cycle starts. In T10 to T11, a word line is selected and data are read out from the areas specified by the external address. In T11, the data loading process of the next cycle into the register 101 starts. The same process is repeated hereinafter.

An internal address for ECC correction generated by the internal address generation circuit 106 is generated separately from an internal address, and the two addresses are different. The internal ECC process should equally check and correct the data stored in the memory cell array 104, not only the data stored in a local part. The external address is determined by an external system, and the addresses to be accessed are likely to be biased. Thus, it is preferred to previously determine the sequence of addresses to be accessed for the ECC process and specify an internal address so as to scan the entire memory cell array.

The memory system 100 of this embodiment performs the ECC process after the data is read out from the memory cell array 104 and while a plurality of data are successively output from the shift register 101. The transition from the reading process to the ECC process is triggered by switching addresses according to control by the internal ECC control 109. In this example, since four data are sequentially output, three cycles (three clocks) of additional time are generated.

The ECC process of this embodiment performs data reading from the memory cell array, ECC checking and correction, and data writing to the memory cell array in each clock timing of the three successive clocks. In the reading process, no access is made to the memory cell array 104 during the burst output cycle from the register 101. Thus, the ECC process does not conflict with the data reading process, and substantially no delay occurs in the reading process.

Hence, the ECC process is not recognized by an external device outside of the system, thereby preventing reduction in the processing speed of the whole system. As the amount of internal transmission data increases, the percentage of an ECC error correction code decreases. The amount of internal data is preferably large in order to reduce the area of the memory cell array. In the case of 144-bit data, for example, the increase of memory due to the ECC code is about 6%, which is substantially equal to or less than that due to redundancy, thus having only small impact on the chip area. The ECC process and the burst transfer do not necessarily coincide perfectly, as long as the ECC process is performed in such timing that it does not cause a delay in the reading/writing process.

This embodiment explains the case of performing one cycle of ECC process when burst-transferring four data in one cycle. It is, however, possible to perform two cycles of ECC process in the system where eight data are burst-transferred. In the system where two data are burst-transferred, it is possible to break up one cycle of ECC process into several sections and perform each process section in a different burst output cycle from the register 101. For simplification of operation and circuit, it is preferred to perform one or more cycles of ECC processes in one cycle of burst output. Thus, an appropriate burst length and latency for the ECC process may be selected. These assertions are also valid for the below-described writing process.

Figure 3:
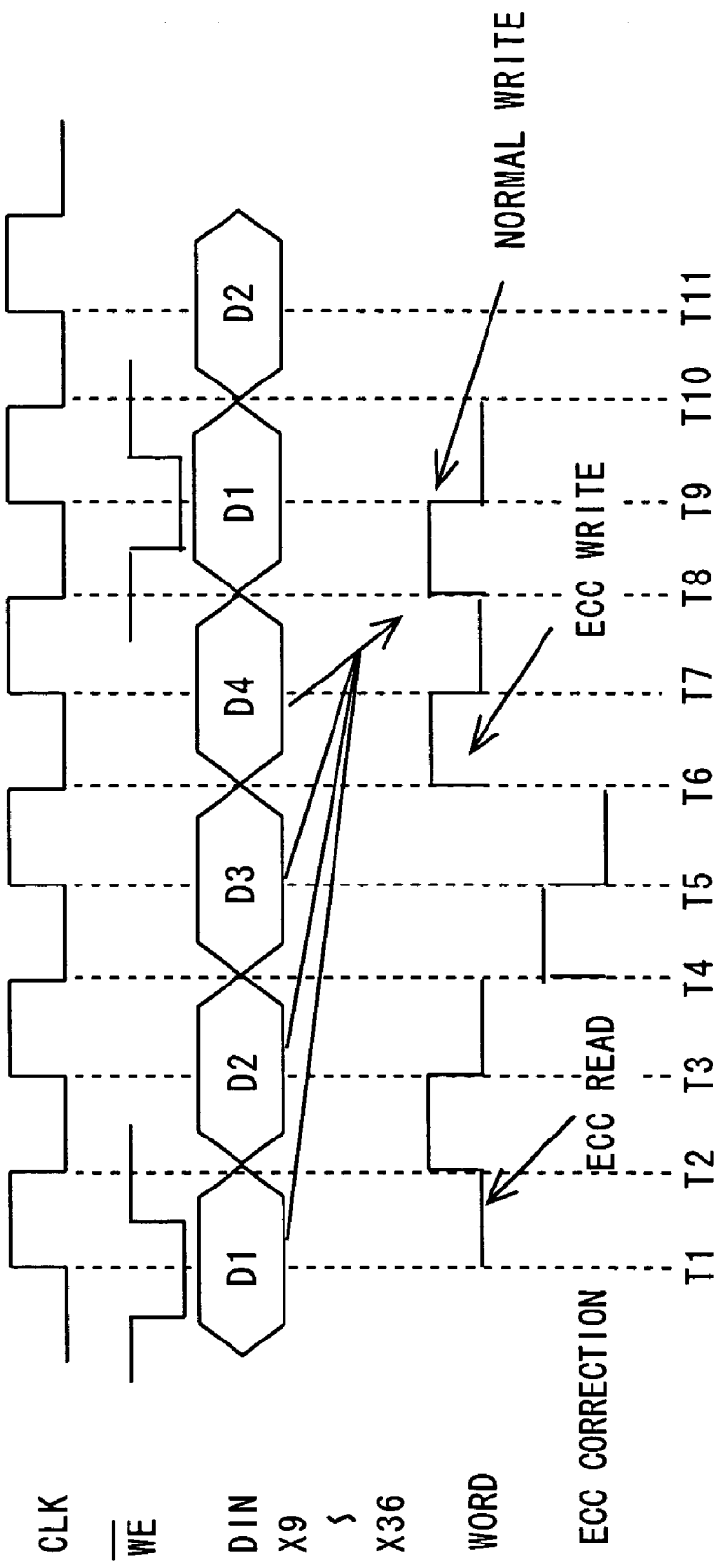
FIG. 3 is a timing chart relating to an ECC process accompanying a writing process in the memory system according to the first embodiment of the present invention.

Referring then to FIG. 3, a timing chart to explain the ECC process in the memory system 100 of this embodiment is shown. It shows the timing of the ECC process in the data writing process. The ECC process is performed in such timing that it does not cause a delay in the writing process. Basically, the operation is the same as the ECC process in the reading process. T(N) indicates timing, and it is a rise timing if N is an uneven number and is a fall timing if N is an even number. The ECC process is performed in parallel with the writing process.

Upon input of D1 data to the input pin of the memory system 100, a write enable signal (WE) becomes active and the loading of the input data to the register 101 starts. In the timing T2 to T3, ECC data is read out from the area specified by an internal address. The ECC data contains original data and an ECC code. In the timing T4 to T5, the ECC check and correct circuit 105 performs ECC checking and correction. In T6 to T7, the data in which the ECC process has been performed is written to the original address in the memory cell array 104. The written data contains the ECC code in addition to the original data.

In the timing T8 to T9, external input data is written to the memory cell array 104 according to an external address selected by the multiplexer 108. The multiplexer 107 selects one from the external write data and the ECC-processed write data according to control by the internal ECC control 109. The timing period T2 to T7 during which the ECC process is performed is within the cycle of the burst inputting of the external data to the register 101 and the serial-parallel conversion circuit 102.

By performing the ECC process while data are sequentially input to the register 101 and the serial-parallel conversion circuit 102, it is able to prevent the ECC process from substantially delaying the normal writing process. In the example shown in FIG. 3, four serial data are sequentially input in every one clock timing and converted from serial to parallel. Since the four data can be written to the memory cell array in one writing process, three cycles (three clocks) of additional time is generated. The ECC process of this embodiment performs data reading from the memory cell array, ECC checking and correction, and data writing to the memory cell array in each clock timing of the three successive clocks.

In this embodiment, the cycle of the ECC process may be changed according to an error rate. The ECC process is performed in the predetermined cycle. The ECC cycle modification circuit 112 changes the cycle of the ECC process based on an ECC error signal from the ECC check and correct circuit 105. When the ECC check and correction circuit 105 detects an ECC error, an ECC error signal is sent from the ECC check and correct circuit 105 to the ECC control circuit 109. In response to the error detection, the ECC cycle modification circuit 112 shortens the preset cycle of the ECC process. If, on the other hand, an ECC error is not detected for a predetermined period of time, the ECC cycle modification circuit 112 lengthens the preset cycle of the ECC process. In this way, changing the cycle of the ECC process in response to the frequency of errors enables to reduce the power consumption according to the system reliability. In the case of a mobile system used in various environments, for example, it is able to enhance the reliability by shortening the ECC process cycle in a high error rate environment and is also able to reduce the power consumption by lengthening the cycle in a low error rate environment. The change of the ECC process cycle may be applied also to the embodiments described below. Though the ECC process of this embodiment is particularly suitable for the correction of soft errors, it is not limited thereto and is also effective for other types of memory errors, such as an error similar to a hard error caused by fluctuations due to miniaturization. This is valid for the below-described embodiments.

Embodiment 2

Figure 4A:
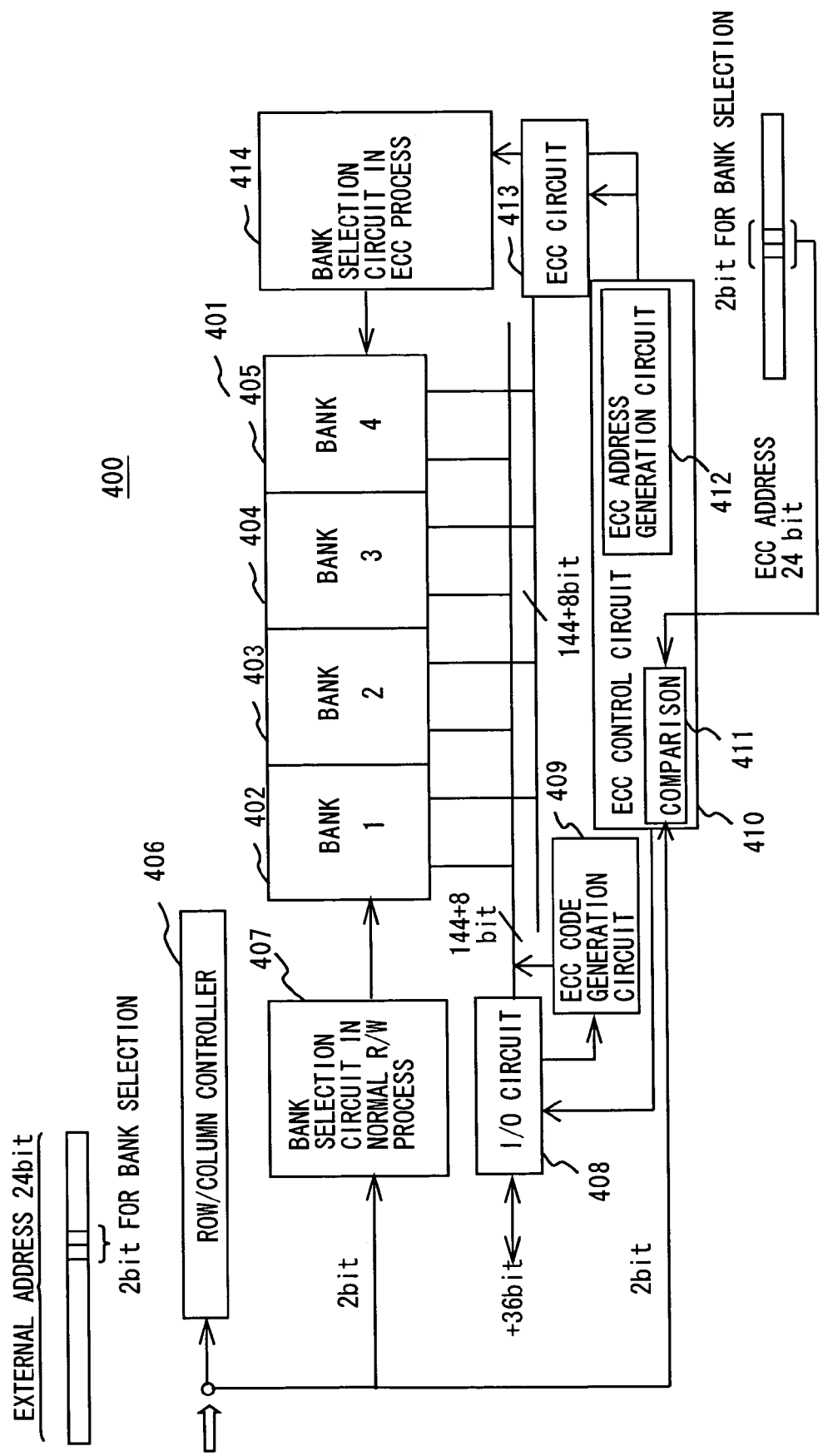
FIGS. 4A and 4B are block diagrams illustrating a memory system configuration according to the second embodiment of the present invention.

Referring now to FIG. 4A, a block diagram illustrating the exemplary configuration of a memory system 400 according to the second embodiment of this invention is shown. The memory system 400 of this embodiment includes a memory cell array that is divided into a plurality of banks. FIG. 4A shows a memory cell array consisting of four banks as an example. In the memory system 400 in FIG. 4A, a memory cell array 401 consists of four banks 402 to 405. A row/column controller 406 controls the selection between a word line and a bit line according to an external address. A normal bank selection circuit 407 selects a bank for a normal reading/writing process.

In the example of FIG. 4A, 24-bit external address includes 2-bit data for bank selection. An I/O circuit 408 inputs or outputs data and control signals to or from an external system. An ECC code generation circuit 409 generates an ECC code according to input data. An ECC control circuit 410 controls each circuit for the ECC process. The ECC control circuit 410 includes a comparison circuit 411 and an ECC address generation circuit 412. The comparison circuit 411 compare and determine whether a bank in which the normal reading/writing process is to be performed and a bank in which the ECC process is to be performed are the same or different.

The ECC address generation circuit 412 generates an ECC address, which is an internal address different from an external address, for the ECC process. The ECC address contains information for bank identification information and bank address information. In the example of FIG. 4A, 2-bit data is assigned for the bank selection. An ECC circuit 413 obtains original data and an ECC code from the memory and performs ECC checking and correction. An ECC bank selection circuit 414 selects a bank according to an ECC address in the ECC process.

In the normal reading/writing process, an external address input from the outside specifies a bank of the memory cell array 401 and an address in the bank. While the external address is sent to the row/column controller 406, the 2-bit data for bank selection contained in the external address is input to the normal bank selection circuit 407. The normal bank selection circuit 407 selects one bank of the memory cell array 401 according to the input data.

In the reading process, data is read out from a specified bank address to the bus and then output to an external system through the I/O circuit 408. In the writing process, write data from the outside is input to the ECC code generation circuit 409 through the I/O circuit 408. The ECC code generation circuit 409 generates an ECC code based on the input data. The external input data and the ECC code are written to a specified bank address through the bus. FIG. 4A shows 144-bit data with 8-bit ECC code, for example.

The memory system 400 performs the ECC process on the data stored in a bank different from a bank selected in the normal reading/writing process. This enables to perform the ECC process without substantially delaying the reading/writing process. A specific operation is explained now. Unlike the first embodiment, this embodiment performs the ECC process in timing independent of the timing of the normal reading/writing process. The timing operation in the first embodiment may be applied to this embodiment.

The ECC process is performed under the control of the ECC control circuit 410. The ECC generation circuit 412 generates an ECC address, which is an internal address for the ECC process. The generated ECC address contains 2-bit bank selection data just like the address format of the external address. The ECC circuit 413 obtains the ECC address and transmits the bank selection data to the ECC bank selection circuit 414. The ECC bank selection circuit 414 selects a bank based on the obtained bank selection data.

The ECC circuit 413 obtains the data stored in the area specified by the ECC address and performs ECC checking and correction. Upon completion of the ECC check and correct process, the data is written back to its original address in the memory. The ECC check and correct process may be performed in the same manner as in the first embodiment. The original data and ECC code are obtained from the memory cell array through a bus dedicated for the ECC Process. Since the memory system 400 has the bus for the normal reading/writing process and the bus for the ECC process, it can perform the two processes in parallel at the same time.

The ECC control circuit 410 has the comparison circuit 411. The comparison circuit 411 obtains bank selection data of the external address and bank selection data of the ECC address and compares them to determine if the bank for the normal reading/writing process and the bank for the ECC process are the same or different. If the banks are different, the ECC process is performed since it does not conflict with the normal reading/writing process. If the banks are the same, on the other hand, the ECC control circuit 410 stops the ECC process in order not to interrupt the normal reading/writing process. It is thereby able to control the ECC process in such a way that it does not cause a substantial delay in the normal reading/writing process.

Figure 4B:
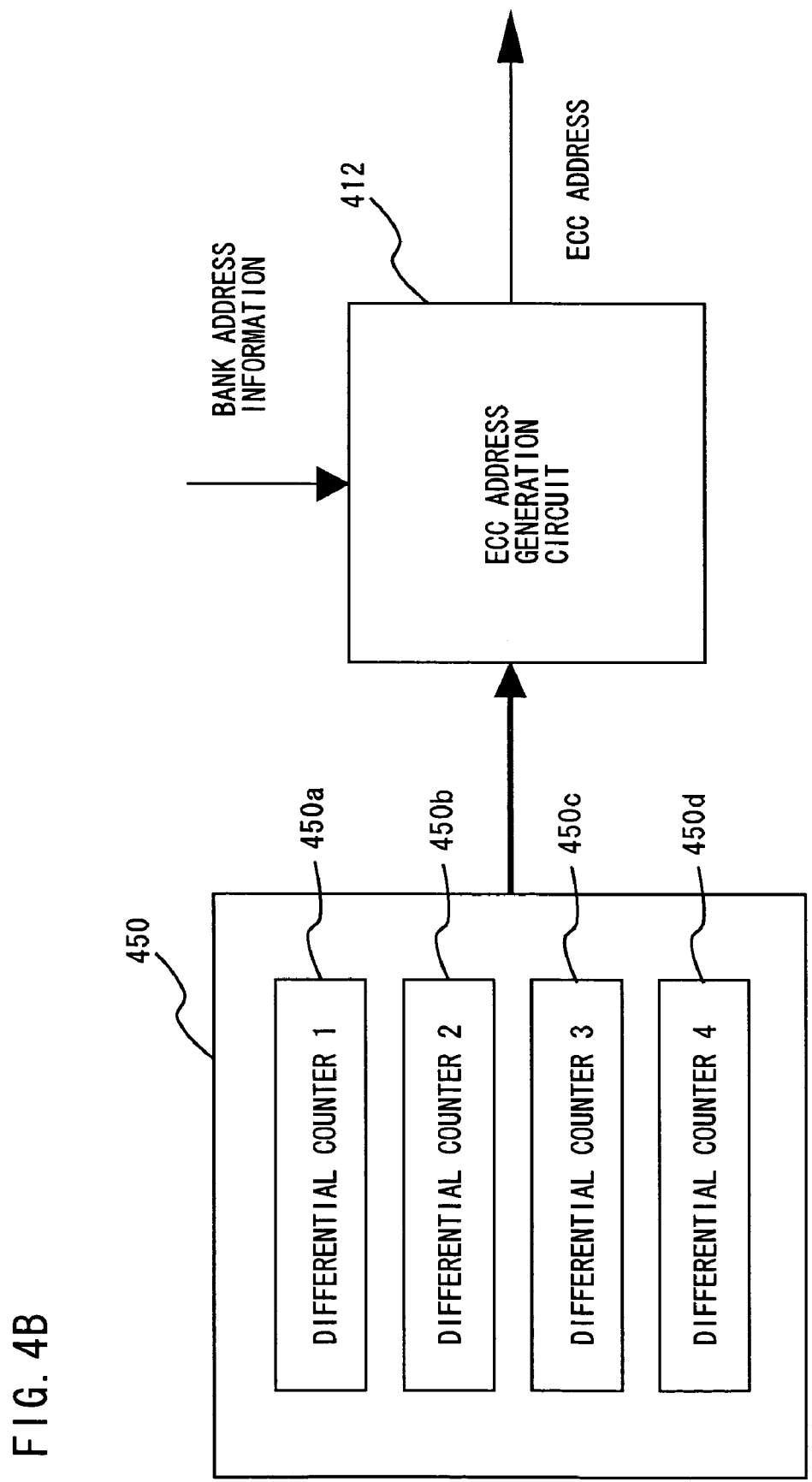

A preferred ECC address generation process in the ECC control circuit 410 is explained hereinafter with reference to FIG. 4B. To increase the SER improvement effect, it is preferred to perform the ECC checking equally in the memory cell array. The ECC control circuit 410 thus preferably has a function to check and achieve the equalization of the ECC process. Preferably, the ECC process is repeated in each bank in the same sequence from a check start address to a check end address, and this sequence is not reset at the interruption of the ECC checking by an external bank access. Specifically, the ECC checking is performed repeatedly in the sequence of addresses 0, 1, 2, to n, then in the addresses 0, 1, 2, to n, and so on. If the ECC checking is interrupted by the external bank access when the checking of the address "m" is completed, it is resumed from the address (m+1).

The ECC control circuit 410 preferably stores interrupted address information indicating where the ECC checking ends in each bank. For example, the addresses in which the ECC checking has been performed or the address to be checked next is stored in association in the bank. Storing the interrupted address information of the ECC process enables to resume the ECC checking from the next address when the ECC checking is interrupted by external bank access. The interrupted address information may be stored in the ECC control circuit 410 in association with bank identification information.

It is further preferred that the ECC control 410 has a differential counter 450 to monitor a difference in the frequency of the ECC checking among banks. The differential counter 450 consists of differential counters 450a to 450d, each corresponding to each bank. A bank with the low frequency of ECC checking is determined with the differential counter 450 and the ECC checking is performed in this bank with the low checking frequency in preference to other banks. This can improve the equality of the ECC checking frequency among the banks.

The operation of the ECC control circuit 410 when an external access bank and an ECC check bank are the same is explained below. The comparison circuit 411 determines that an external access is attempted on the bank where the ECC checking is being performed. Since the external access has priority over the ECC checking, the ECC control circuit 410 controls the bank selection circuit 414 and the ECC circuit 413 so as to stop the ECC process in this bank. The ECC control circuit 410 inputs information to the differential counter of the bank to indicate that the ECC checking is performed in this bank one time fewer than in the other banks.

Then, the ECC control circuit 410 specifies the bank where the ECC checking frequency is the lowest in all the banks except the externally accessed bank, according to the differential counter information stored in the differential counter 450. Then, in order to start the ECC process in the specified bank, the ECC control circuit 410 obtains bank address information as the interrupted address information stored in the bank for the ECC checking. In this example, the bank address information is the last address where the ECC checking is performed. The ECC address generation circuit 412 generates an ECC address according to the bank information specified by the differential counter information and the bank address.

The next address of the bank address is selected as the ECC address. The bank selection circuit 414 selects a bank according to the ECC address, and the ECC circuit 413 performs the ECC process in this bank. The ECC control circuit 410 counts up the bank address information stored in the bank and increases by one the differential counter 450 of the bank where the ECC checking is performed. The maximum value of the differential counter is determined depending on the bias in bank selection and varies by systems using the memory. Thus, an appropriate value is set according to the environment.

This embodiment is applicable to various memory systems, regardless of burst transfer. Though this embodiment is described in conjunction with SRAM, the present invention may be applied also to DRAM.

The effects of this embodiment are now examined. A soft error rate SER in memory having N number of banks, without an ECC circuit, is fn [FIT (Failure In Time)]. One FIT indicates that an error occurs once in every $10^9$ hours per device. If SER when this embodiment is applied is Fn [FIT], Fn may be expressed as below, using fn.

Firstly, a case where the normal reading/writing (R/W) operation is always performed in one bank is examined as the first case. Since the R/W operation is performed only in a single bank, other banks are completely remedied by the ECC. Thus, SER is affected by one bank. The memory cell used for R/W and not remedied by the ECC becomes 1/N. SER in this case is:

$$Fn = fn/N$$

However, such use is very rare in normal systems.

Next, a case where the normal R/W operation is performed equally (randomly) to N number of banks is examined. It is assumed that a time required for the ECC circuit to operate once for all the memory cells is $T_0$ [hr]. If a normal operation bank and an ECC operation bank are always different, simplified SER is:

$$Fn = fn * T_0/10^9$$

Assuming that the normal operation and the ECC operation are performed randomly, independent of each other, in each bank, the possibility that the normal operation bank and the ECC operation bank are the same is:

$$(1/_NC_1) * (1/_NC_1)$$

Since $_NC_1 = {}_NP_1/1! = N/1 = N$, $$(1/_NC_1) * (1/_NC_1) = (1/N) * (1/N)$$

If it is highly likely that the ECC process has been finished in N or (N−1) number of bank cells since a SER rate is low, (N−1) number of banks have been possibly ECC-corrected with the above possibility. Since 1/N number of cells of the entire chip have the risk of SER, $$SER = fn * (1/N * (1/_NC_1) * (1/_NC_1))$$
$$= fn * (1/N * (1/N) * (1/N))$$

On the other hand, the possibility that the normal operation bank and the ECC operation bank are different is:

$$1 - (1/_NC_1) * (1/_NC_1)$$

SER in this case is:

$$SER = fn * (1 - (1/_NC_1) * (1/_NC_1)) * T_0 10^9$$

Since SER of the entire chip is sum of the above two FIT values, SER is:

$$Fn = fn * (1/N^3) + fn * T_0/10^9 * (1 - 1/N^2)$$
$$= fn * (1/N^3 + T_0/10^9 * (1 - 1/N^2))$$

The above examinations tell that the effects of this embodiment are enhanced by increasing the number of banks N. Since a normal number of N is currently 16 to 64, it is able to improve the FIT value by triple digits. The case of the first embodiment where the ECC checking is performed regularly without depending on an external access is always equivalent to the above best case, and SER is expressed as:

$$Fn = fn * T_0/10^9.$$

$T_0$ is estimated to the order of $10^{-5}$ [hr], assuming that one time of ECC correction is performed in several tens of cycles, when I/O data is 36 bits and four data are burst-transferred, in memory with the operating frequency of 200 MHz and the capacity of 144 Mbit. Thus, the value of Fn is about 14 orders of magnitude less than that in the case where the present invention is not applied, thereby significantly improving SER.

Embodiment 3

Figure 5:
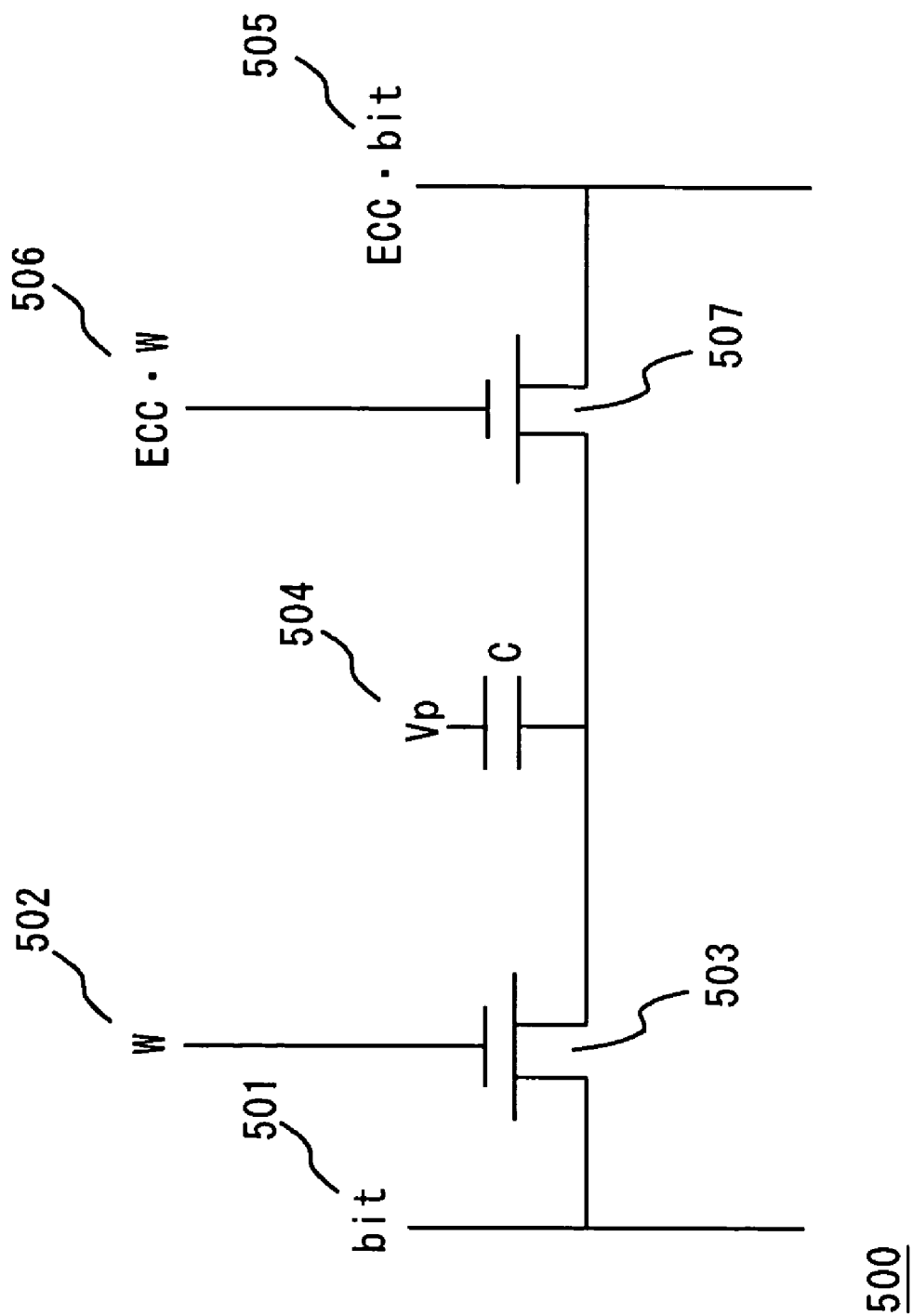
FIG. 5 is a circuit diagram illustrating a memory cell circuit configuration according to the third embodiment of the present invention.

Referring now to FIG. 5, a circuit diagram illustrating the circuit configuration of a memory cell 500 used in a memory system according to the third embodiment of the present invention is shown. The memory cell 500 of this embodiment is a dual-port memory cell having two input/output ports. The memory cell 500 has a normal bit line 501, a normal word line 502, and a normal transistor 503, each for the normal reading/writing process. A capacitor 504 serves as a charge retention element that retains data by storing a charge. The memory cell 500 also has an ECC bit line 505, an ECC word line 506, and an ECC transistor 507, each for the ECC process. NMOS is typically used for the transistor as a switching element.

In the normal reading/writing process, a memory cell is selected according to an external address. The normal word line 502 thereby becomes active and the normal transistor 503 turns on. With the electrical discharge from the capacitor 504 to the normal bit line 501 or the electrical charge to the capacitor 504 through the normal bit line 501, the reading or writing of data to or from the memory cell is performed. The reading/writing process is controlled by control signals such as a row address strobe signal, a column address strobe signal, an output enable signal, and a write enable signal.

The ECC process, on the other hand, uses the ECC bit line 505, ECC word line 506, and ECC transistor 507, which are different from the lines used in the normal reading/writing process. In the ECC process, a memory cell is selected according to an internal address for ECC. The ECC word line 506 thereby becomes active and the ECC transistor 507 turns on. Data is read from the capacitor 504 through the ECC bit line 506. The ECC checking and correction is performed on this data, and then the data is written back to the same cell. The ECC process is controlled by an ECC timing control signal. The ECC process is controlled in such a way that the ECC writing process to a memory cell does not conflict with the normal writing process to the memory cell.

The memory cell configuration of this embodiment is applicable to various memory systems. For example, it may be applied to the memory system described in the first embodiment. Since the memory system performs the ECC process and the reading/writing process in parallel, it preferably has a dedicated line for the ECC process. Though the ECC process in the memory system of the first embodiment is performed in a specific timing during the normal reading/writing process, the ECC process in the memory system having the memory cell of this embodiment is not limited to such timing, which allows more flexible timing control of the ECC process. Further, this embodiment enables to perform a refresh process using the ECC dedicated line. Though this embodiment is described in conjunction with DRAM, the present invention may be applied also to SRAM.

Embodiment 4

Figure 6:
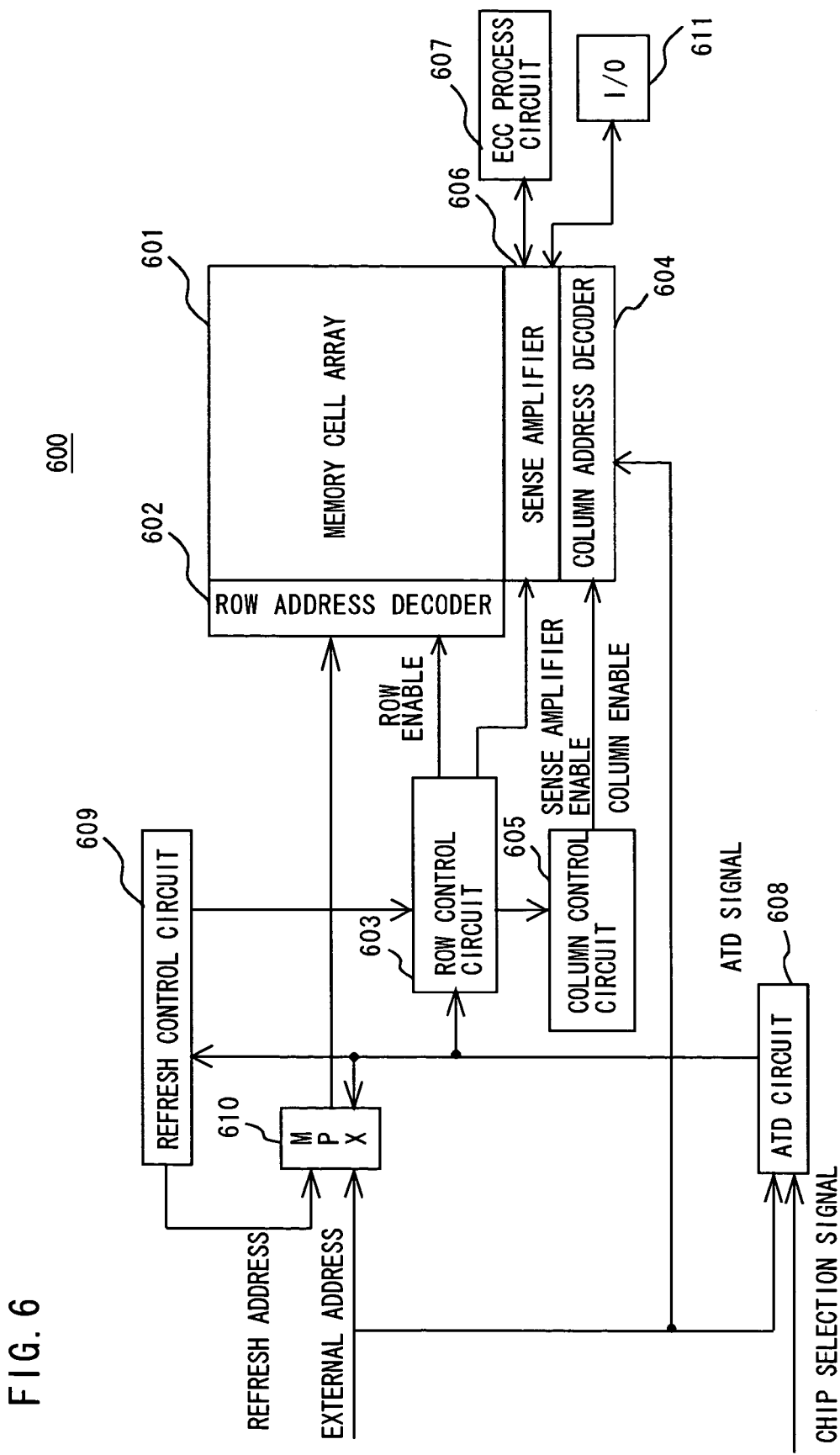
FIG. 6 is a block diagram illustrating a memory system configuration according to the fourth embodiment of the present invention.

Referring now to FIG. 6, a block diagram illustrating the schematic configuration of a memory system 600 according to the fourth embodiment of the present invention is shown. The memory system 600 of this embodiment performs a refresh process inside without recognition by the outside when it is activated by a chip selection signal. The address to be refreshed is generated in an internal circuit, independent of an external address. The memory system 600 performs the reading/writing process and the refresh process in one external access cycle. Further, the ECC process is performed integrally with the refresh operation of the memory cell. This enables to perform the ECC process without causing a delay in the reading/writing process.

In the memory system 600 in FIG. 6, a memory cell array 601 stores data, and a row address decoder 602 selects a word line according to an input row address. The row address decoder 602 performs decoding according to a row enable signal from a row control circuit 603. A column address decoder 604 selects a bit line according to an input column address. The column address decoder 604 performs decoding according to a column enable signal from a column control circuit 605. The column control circuit 605 outputs a column enable signal according to a control signal from the row control circuit 603. A sense amplifier 606 amplifies a voltage from the memory cell.

An ECC process circuit 607 performs the ECC process. An ATD (Address Transition Detector) circuit 608 detects the transition of external addresses when a chip selection signal is active, and outputs an ATD pulse signal according to the address transition. A refresh control circuit 609 generates an address to be refreshed. The refresh control circuit 609 is controlled by an ATD signal from the ATD circuit 608. A multiplexer (MPX) 610 selects one from an external address and a refresh address according to the ATD signal, and outputs it to the row address decoder 602. An I/O circuit 611 inputs or outputs data to or from an external device. The typical memory system 600 further includes several other circuit components, which are omitted here to simplify the description.

The normal reading/writing process in the memory system 600 is explained below. Upon input of an external address, a word line selected by the row address decoder 602 according to a row address is activated, and the data retained in the memory cell is latched into the sense amplifier 606 through a bit line. The column address decoder 604 selects a bit line according to a column address. In the reading process, a status value of the sense amplifier 606 corresponding to the selected bit line is read out and output to the external via the I/O circuit 611. In the writing process, the status value of the sense amplifier 606 corresponding to the selected bit line is rewritten and changed to the data input via the I/O circuit 611. Then, one line of data latched in the sense amplifier 606 is written to the row address selected by the previous process.

The memory system 600 of this embodiment performs the refresh process and the accompanying ECC process in such timing that it does not delay the reading/writing process. When the normal reading/writing process is not performed for more than a predetermined time, the refresh process is performed according to a timer in the refresh control circuit 609. The refresh process is performed according to a refresh address generated by the refresh control circuit 609.

The memory system 600 performs the refresh process and the accompanying ECC process in the cycle of the reading/writing process. In this example, the refresh and ECC processes are performed during the waiting time in the reading/writing process where an external address is not determined. The process operation of the memory system 600 is explained below in conjunction with the reading process. When the transition of external addresses occurs in an active state, the ATD circuit 608 detects it and outputs an ATD signal. The value of the external address in a register (not shown) has not been determined in this timing. According to the ATD signal, the MPX 610 selects the refresh address from the refresh control circuit 609 and outputs it to the row address decoder 602. According to the control signal from the refresh control circuit 609 and the ATD signal, the row control circuit 603 outputs an active row enable signal to the row address decoder 602.

The row address decoder 602 activates the word line selected according to the refresh address. The row control circuit 603 outputs an active sense amplifier enable signal to the sense amplifier 606. The data retained in the memory cell at the activated word line is latched into the sense amplifier 606 through a bit line. The latched data is transmitted to the ECC process circuit 607. The ECC process circuit 607 performs the ECC process and outputs the data to the sense amplifier 696. The sense amplifier 606 writes the ECC-processed data to the original memory cell.

Upon completion of the refresh process and the ECC process, the ATD signal becomes inactive and the MPX 610 selects an external address. According to a row enable signal from the row control circuit 603, the row address decoder 602 performs decoding of the external address. The sense amplifier 606 obtains the data on the selected word line according to a sense amplifier enable signal. According to a control signal from the row control circuit 603, the column control circuit 605 outputs a column enable signal to the column address decoder 604.

The column address decoder 604 selects a bit line according to the external address. A status value of the sense amplifier 606 corresponding to the selected bit line is read out and output to the external via the I/O circuit 611. In the writing process also, the refresh process and the ECC process are performed during the waiting time prior to the writing process in the access cycle, as in the reading process.

Embodiment 5

Figure 7:
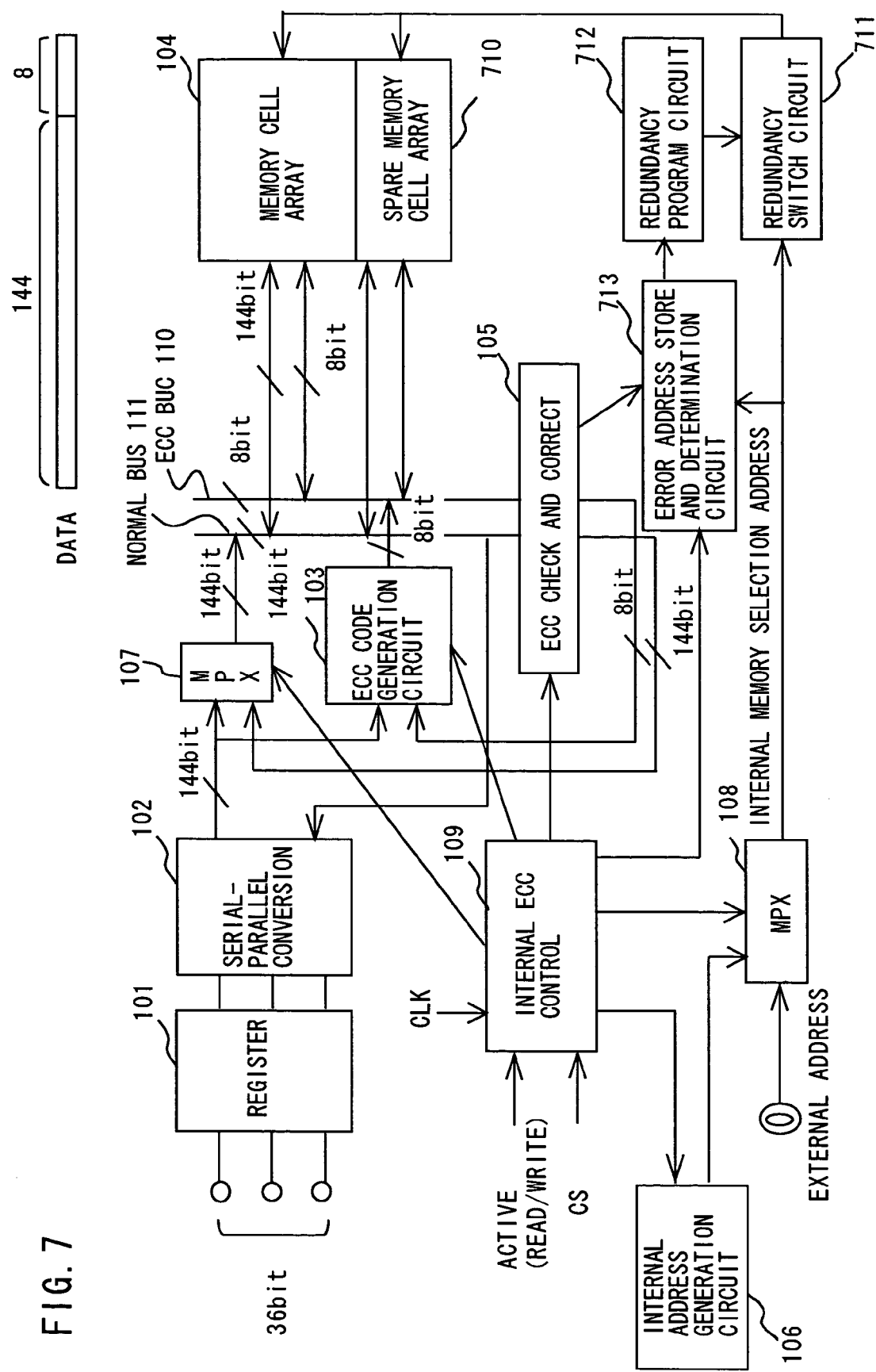
FIG. 7 is a block diagram illustrating a memory system configuration according to the fifth embodiment of the present invention.

Referring now to FIG. 7, a block diagram illustrating the configuration of a memory system 700 according to the fifth embodiment of the present invention is shown. The memory system 700 of this embodiment is particularly effective for correcting errors due to device fluctuations. Soft errors are caused by not only alpha rays and cosmic rays which are generated randomly, but also by device fluctuations due to device miniaturization. Most typically, a memory cell with a large fluctuation which has passed the operational test in the manufacturing process can cause an error in the operation of a real system.

Since the cause of the error is fluctuations, it is likely that the system starts to operate normally again after a period of time. However, the error period is not constant and there is no reproducibility. Though the soft error occurs not randomly but in a specific cell, it is unable to completely reject the error in the manufacturing process. The memory system 700 of this embodiment solves this problem with the following configuration.

The configuration of the memory system 700 shown in FIG. 7 is explained below. The memory system 700 corrects defects due to fluctuations by using a redundancy circuit. The elements denoted by the same reference symbols as in FIG. 1 have substantially the same structure, and redundant description is omitted. In the memory system 700 shown in FIG. 7, a spare memory cell 710 stores data instead of an error cell, if any, in the memory cell array 104. A redundancy switching circuit 711 switches the access destination of a specific address to the spare memory according to an internal memory cell selection address. A redundancy program circuit 712, which is a programmable circuit, changes the switching operation of the redundancy switching circuit 711.

An external address or an internal address for the ECC process is selected by the MPX 108 and input to the redundancy switching circuit 711 as an internal memory cell selection address. The redundancy switching circuit 711 controls the memory cell array 104 and the spare memory cell array 710 according to the redundancy program circuit 712 so that data is written to or read from a cell corresponding to the input address. A path is set to allow a specific internal memory cell selection address to access the spare memory cell array. An error address determination circuit 713 stores cell addresses where an error is detected by the checking of the ECC check circuit and compares them with a cell address where an errors is detected by the subsequent ECC checking.

If the ECC check and correct circuit 106 determines that the data stored in a specific address of the memory cell array is an error, this address is sent to the error address determination circuit 713. The error address determination circuit 713 stores addresses which have been determined an error in the past ECC process. The error address determination circuit 713 compares the address with the stored addresses to check the presence of the identical address. If no identical address is found, corrected data from the ECC check and correction circuit 106 is written back to the original address in the memory cell array 104. The error address determination circuit 713 stores the addresses determined as an error.

If, on the other hand, an identical address is found, the error address determination circuit 713 determines that the error is a soft error due to fluctuations and makes necessary modification to the redundancy program circuit 712. According to the modified redundancy program circuit 712, the redundancy switching circuit 711 operates to block the path for a selected address to the error cell and assign this address to a specific cell in the spare memory cell array. The circuit state of the redundancy switching circuit 711 is fixed by the redundancy program circuit 712. The rule for the modification of the redundancy program circuit 712 by the error address determination circuit 713 is appropriately determined by design. For example, the modification may be carried out when the error occurs again within a predetermined period of time or when the error is detected more than a predetermined number of times.

Te data corrected by the ECC check and correct circuit 106 is written to a specific spare cell in the spare memory cell array 710 through a selected path that has been redundancy switched. In the subsequent process, when an external access request is made to the address determined as an error, the assigned spare cell is selected and accessed. The memory cell determined as a soft error due to fluctuations is never used in the rest of process. This is equivalent to a redundancy remedy function to remedy the cell that substantially becomes an unrecoverable error (equivalent to a hard error) in the course of operation.

The error is recognized from the outside of the memory system only when error data is output by an external read request during the period from the error occurrence to the error correction in the system. Thus, if the error is corrected only in the internal ECC circuit, the ECC correction is repeated as long as the malfunction of cell due to fluctuations continues, which rapidly increases an error rate due to fluctuations. The system configuration of this embodiment does not use the cell once a fluctuation error is detected, thereby significantly decreasing the soft error rate. This technique is applicable not only to SRAM and DRAM, but also to a nonvolatile storage element and other storage elements. Further, this technique can remedy not only the cells with normal soft errors, but also the cells with substantially hard errors due to characteristic change with time and so on.

Embodiment 6

In the case of performing the ECC process on a plurality of addresses of data, there is a problem of physical mapping of data on a memory cell array. It is unable to remedy multi-bit errors due to SER in the memory cell data physically adjacent to each other. This is because the soft error in the multi-bit mode destroys the data in a plurality of cells adjacent to each other all together; on the other hand, the ECC process cannot correct 2-bit data. Thus, if a plurality of addresses of data on which the ECC process is to be performed are stored in the cells adjacent to each other, it is unable to correct the error data by ECC.

FIG. 8 is a view to explain the physical mapping of data in a memory system 800 of this embodiment. FIG. 8B is a view to explain conventional mapping as a comparative example. Referring first to FIG. 8A, the cells corresponding to an address 1 are placed separately from each other. The cells corresponding to an address 2 are also placed separately from each other. Further, the cell of the address 1 and the cell of the address 2 are also placed separately form each other. In this arrangement, the ECC process using a plurality of addresses of data can function effectively.

Referring then to FIG. 8B, though the cells corresponding to the address 1 are placed separately from each other, the cell corresponding to the address 1 and the cell corresponding to the address 2 are placed adjacent to each other. 2A is an adjacent bit in the row direction and 2B is an adjacent bit in the column direction. 2C is an adjacent bit adjacent to a cell at the address 1 in another cell matrix area (I/O area) located next. When performing the ECC process on these plurality of addresses (addresses 1 and 2), it is likely to fail to remedy the multi-bit errors.

The memory system 800 thus stores a plurality of addresses of data for the ECC process in the cells separated from each other, not adjacent to each other, in the physical mapping of data on the memory cell array 801. By performing the ECC process on the data (each data bit length k) for a plurality of (n times of) address accesses (total data length k×n), it is able to perform the error correction with a small area. Since a plurality of addresses of data are physically mapped in the cells separated from each other, not adjacent to each other, it is able to correct soft errors in the multi-bit mode.

In the memory system 800, a row/column controller 802 converts an external address input from the outside and outputs the converted address to column selection circuits 803a, 803b, and a row selection circuit (not shown). The column selection circuits 803a and 803b each have a sense amplifier (SA) and a write amplifier (WA). The column selection circuits 803a and 803b are associated with cell matrix areas (I/O areas) 801a and 801b, respectively, to perform the reading/writing process in the associated I/O area.

The I/O areas 801a and 801b corresponding to each data I/O are placed adjacent to each other. The row/column controller 802 outputs a common X, Y selection signal, for one address, to each of the column selection circuits 803a, 803b, and the row selection circuit, for example. The column selection circuits 803a, 803b, and the row selection circuit select a cell by address-decoding the common X, Y selection signal. Since the address change in the I/O areas 801a and 801b is common, the selected cells can be always physically separated from each other. Each cell of the bit (32 bits, for example) for one address is thereby selected in order not to be adjacent to each other.

The memory system 800 corrects errors in a plurality of addresses (for example, 32-bit data×4 addresses=128 bits) of data. Since the internal ECC circuit may have the configuration described in other embodiments or a widely-known configuration, the explanation is omitted here. The row/column controller 802 performs decoding and mapping in such a way that bit data of the plurality of addresses are stored in the cells separated from each other. Each selected cell is separated from another selected cell in one I/O area, and it is also separated from a cell in the adjacent I/O area. It is preferred to select a cell of more than three bits away (an adjacent bit is a cell one bit away).

In the decoding process, for one address in the cell array 801, an address is selected from the cells at addresses except the contiguous addresses (the address 2A in FIG. 8B), the address (the address 2B in FIG. 8B) which is the number of column bits of the I/O area (8th bit in FIG. 8B) away, for example. In the case where the cells at the edge of the I/O area are included, the address is selected from the cells at addresses except the address (the address 2C in FIG. 8B) which is the number of column bits of the I/O area minus 1 (7th bit in FIG. 8B) away, in addition to the above addresses. In this way, each data at a plurality of addresses for the ECC process is stored in memory cells separated from each other, which enables to perform SER on a plurality of addresses effectively. The method of storing a plurality of addresses of data for the ECC process in memory cells separated from each other is not limited to those described in this embodiment, and it is possible to select a memory cell physically separated from each other by another embodiment.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A memory device comprising:
    a memory cell array comprising a plurality of memory cells for storing data, where access is controlled by an address; and
    an Error Check and Correct (ECC) process circuit for performing an ECC process on data stored in a memory cell in the memory cell array, wherein
    a reading/writing process in the memory cell array is performed according to a received external address, and
    the ECC process is performed according to an internal address different from the external address during a cycle of the reading/writing process.

2. A memory device according to claim 1, further comprising an internal address generation circuit for generating the internal address independent of the external address.

3. A memory device according to claim 1, wherein the ECC process is performed during a burst transfer timing period for sequentially transferring a plurality of data.

4. A memory device according to claim 3, wherein the ECC process circuit performs data obtaining, error checking, necessary error correction, and data output to the memory cell array within a time period required for one cycle of burst transfer.

5. A memory device according to claim 3, wherein the ECC process circuit divides one cycle of ECC process comprising data obtaining, error checking, necessary error correction, and data output to the memory cell array into several sections to perform the one cycle of ECC process in a plurality of cycles of burst transfer.

6. A memory device according to claim 1, wherein the memory cell array comprises a plurality of banks, and the ECC process circuit performs the ECC process on data stored in a bank where external data reading/writing is not being performed.

7. A memory device according to claim 6, further comprising an ECC control circuit for controlling the ECC process so as to stop the ECC process on a bank where the ECC process is being performed in response to an external access to the bank.

8. A memory device according to claim 6, further comprising an ECC control circuit for controlling the ECC process so as to stop the ECC process or skip the ECC process on a bank where the ECC process is to be performed next in response to an external access to the bank.

9. A memory device according to claim 6, further comprising:
    a storage unit for storing information for determining a difference in a number of the ECC process performed in each bank; and
    an ECC control circuit for controlling the ECC process so as to perform the ECC process preferentially on a bank where the number of the ECC process performed is smaller than other banks, based on the information.

10. A memory device according to claim 6, wherein the ECC process in a bank is repeated in a fixed sequence of addresses, and, if the ECC process on a bank is stopped, the ECC process is resumed from an address after an address where the ECC process is completed.

11. A memory device according to claim 6, further comprising:
a storage unit for storing information for determining an address in a bank where the ECC process is stopped; and
an ECC control circuit for controlling the ECC process so as to resume the ECC process from an address determined based on the stored address.

12. A memory device according to claim 1, wherein each of the plurality of memory cells in the memory cell array comprises a first port and a second port, data reading/writing is performed through the first port in a normal reading/writing process, and data reading/writing is performed through the second port in the ECC process.

13. A memory device according to claim 1, further comprising an ECC cycle modification circuit for modifying a cycle of the ECC process based on an error occurrence frequency.

14. A memory device according to claim 1, wherein the memory cell array stores data with a charge retention element, and the ECC process is performed accompanying a refresh process of the memory cell array.

15. A memory device according to claim 1, further comprising:
a spare memory cell for storing data; and
a circuit for switching an access destination to the spare memory cell according to an access address to a cell, if the ECC process circuit detects an error a plurality times in the cell of the memory cell array under a predetermined condition.

16. A memory device according to claim 15, further comprising:
a storage unit for storing an address determined as an error by the ECC process circuit; and
a determination circuit for comparing the stored address and an address newly determined as an error to determine whether to change a destination of access by the address.

17. A memory device according to claim 1, wherein the ECC process circuit performs the ECC process on a plurality of addresses of data, and the plurality of addresses of data are stored in memory cells separated from each other in the memory cell array.

18. A method of correcting an error of data stored in a memory cell array, comprising:
performing a reading/writing process of external data to the memory cell array according to an external address;
generating an internal address, the internal address being different than the external address, used for error correction; and
performing an ECC process including error checking and correction on data stored in an area of the memory cell array specified by the internal address, during a cycle of the reading/writing process of external data to the memory cell array.

19. An Error Check and Correct Process Circuit configured to perform an error check and correct process on data stored in an associated memory cell, the Error Check and Correct (ECC) Process Circuit comprising:
a register configured to send and receive data;
an ECC check and correct circuit configured to detect and correct erroneous data; and
a multiplexer configured to select data from one of data received from the register and corrected data from the ECC check and correct circuit and to transmit the selected data to a selected internal memory selection address of the associated memory cell, the selected internal memory selection address being different than a received external address,
wherein the selected data is placed at the selected internal memory selection address,
wherein the ECC check and correct circuit is configured to perform the ECC process in parallel with the reading process, and
wherein the ECC process is performed according to the selected internal memory selection address and the reading process is performed according to the received external address.

20. The ECC Process Circuit of claim 19, further comprising:
a refresh control circuit configured to perform a refresh process integrally with the detection and correction of erroneous data by the ECC check and correct circuit.

* * * * *